(12) United States Patent
Dysard et al.

(10) Patent No.: US 7,585,340 B2
(45) Date of Patent: Sep. 8, 2009

(54) POLISHING COMPOSITION CONTAINING POLYETHER AMINE

(75) Inventors: Jeffrey M. Dysard, St. Charles, IL (US); Paul M. Feeney, Aurora, IL (US); Sriram P. Anjur, Aurora, IL (US); Timothy P. Johns, Naperville, IL (US); Yun-Biao Xin, Petaluma, CA (US); Li Wang, Aurora, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 11/412,369

(22) Filed: Apr. 27, 2006

(65) Prior Publication Data

US 2007/0251155 A1    Nov. 1, 2007

(51) Int. Cl.
    C09K 3/14    (2006.01)
    B24B 7/19    (2006.01)
    B24D 11/00   (2006.01)

(52) U.S. Cl. .............................. 51/298; 51/307; 451/41; 451/526

(58) Field of Classification Search ................... 451/41, 451/526; 51/298, 307
    See application file for complete search history.

(56) References Cited

U.S. PATENT DOCUMENTS

| 5,196,353 | A | 3/1993 | Sandhu et al. |
| 5,433,651 | A | 7/1995 | Lustig et al. |
| 5,609,511 | A | 3/1997 | Moriyama et al. |
| 5,643,046 | A | 7/1997 | Katakabe et al. |
| 5,658,183 | A | 8/1997 | Sandhu et al. |
| 5,730,642 | A | 3/1998 | Sandhu et al. |
| 5,838,447 | A | 11/1998 | Hiyama et al. |
| 5,872,633 | A | 2/1999 | Holzapfel et al. |
| 5,893,796 | A | 4/1999 | Birang et al. |
| 5,949,927 | A | 9/1999 | Tang |
| 5,964,643 | A | 10/1999 | Birang et al. |
| 6,179,887 | B1 * | 1/2001 | Barber, Jr. .................... 51/298 |
| 6,376,381 | B1 | 4/2002 | Sabde |
| 6,533,832 | B2 | 3/2003 | Steckenrider et al. |
| 6,544,892 | B2 | 4/2003 | Srinivasan et al. |
| 6,840,971 | B2 * | 1/2005 | Wang et al. .................... 51/307 |
| 6,852,632 | B2 | 2/2005 | Wang et al. |
| 6,855,266 | B1 | 2/2005 | Wang et al. |
| 6,867,140 | B2 | 3/2005 | Wang et al. |

(Continued)

FOREIGN PATENT DOCUMENTS

WO    WO 2006/098141    9/2006

OTHER PUBLICATIONS

Huntsman performance chemicals Technical Bulletin for Jeffamine D-230, 2003.*

(Continued)

*Primary Examiner*—Jerry Lorengo
*Assistant Examiner*—Shuangyi Abu Ali
(74) *Attorney, Agent, or Firm*—Thomas E. Omholt; Nancy J. Gettel; Steven D. Weseman

(57) ABSTRACT

The inventive chemical-mechanical polishing system comprises a polishing component, a liquid carrier, and a polyether amine. The inventive method comprises chemically-mechanically polishing a substrate with the aforementioned polishing system.

7 Claims, 11 Drawing Sheets

U.S. PATENT DOCUMENTS

| | | |
|---|---|---|
| 6,910,951 B2 * | 6/2005 | Balijepalli et al. ............ 451/41 |
| 7,059,941 B2 * | 6/2006 | Yoshida et al. ................ 451/41 |
| 7,066,801 B2 * | 6/2006 | Balijepalli et al. .......... 451/526 |
| 2003/0170991 A1 | 9/2003 | Wang et al. |
| 2004/0023491 A1 * | 2/2004 | Lim et al. ................... 438/689 |
| 2004/0166779 A1 * | 8/2004 | Balijepalli et al. ............ 451/41 |
| 2005/0079803 A1 * | 4/2005 | Siddiqui et al. .............. 451/41 |
| 2005/0148187 A1 | 7/2005 | Wang et al. |

OTHER PUBLICATIONS

Internet archive wayback.*
Huntsman performance chemicals Technical Bulletin for Jeffamine Polyoxyalkyleneamine, 2002.*
Huntsman performance chemicals Technical Bulletin entiled "Diamine products", 2005.*

* cited by examiner

POLISHING COMPOSITION CONTAINING POLYETHER AMINE

FIELD OF THE INVENTION

This invention pertains to a polishing composition and a method for polishing a substrate using the same.

BACKGROUND OF THE INVENTION

Compositions, systems, and methods for planarizing or polishing the surface of a substrate, especially for chemical-mechanical polishing (CMP), are well known in the art. Polishing compositions or systems (also known as polishing slurries) typically contain an abrasive material in an aqueous solution and are applied to a surface by contacting the surface with a polishing pad saturated with the polishing composition. When used for polishing substrates comprising metals, the polishing compositions often comprise an oxidizing agent. The purpose of the oxidizing agent is to convert the surface of the metals into a softer, more readily abradable material than the metal itself. Thus, polishing compositions comprising oxidizing agents in conjunction with abrasives generally require less aggressive mechanical abrasion of the substrate, which reduces mechanical damage to the substrate caused by the abrading process. Additionally, the presence of the oxidizing agent frequently increases removal rates for the metals and increases throughput in a production setting.

As a method for isolating elements of a semiconductor device, a great deal of attention is being directed towards a shallow trench isolation (STI) process where a silicon nitride layer is formed on a silicon substrate, shallow trenches are formed via etching or photolithography, and a dielectric layer is deposited to fill the trenches. Due to variation in the depth of trenches, or lines, formed in this manner, it is typically necessary to deposit an excess of dielectric material on top of the substrate to ensure complete filling of all trenches. The excess dielectric material (e.g., an oxide) is then typically removed by a chemical-mechanical planarization process to expose the silicon nitride layer. When the silicon nitride layer is exposed, the largest area of the substrate exposed to the chemical-mechanical polishing system comprises silicon nitride, which must then be polished to achieve a highly planar and uniform surface.

Generally, past practice has been to emphasize selectivity for oxide polishing in preference to silicon nitride polishing. Thus, the silicon nitride layer has served as a stopping layer during the chemical-mechanical planarization process, as the overall polishing rate has decreased upon exposure of the silicon nitride layer. For example, U.S. Pat. No. 6,544,892 and references cited therein describe polishing compositions which provide selectivity of silicon dioxide to silicon nitride. Also U.S. Pat. No. 6,376,381 describes the use of certain nonionic surfactants to increase the polishing selectivity between silicon oxide and silicon nitride layers.

Recently, selectivity for polysilicon polishing in preference to silicon oxide and/or silicon nitride polishing has also been emphasized. For example, U.S. Pat. No. 6,533,832 describes a purported increase in polishing selectivity of polysilicon to interlayer dielectric materials (e.g., silicon dioxide) through the use of an alcoholamine selected from dialkylethanol amine, alkyl diethanol amine, and 2-dimethylamino-2-methyl-1-propanol.

Despite these polishing compositions and methods, there remains a need in the art for polishing compositions and methods that can provide controlled selectivity of polysilicon relative to silicon oxide and/or silicon nitride. The invention provides such compositions and methods. These and other advantages of the invention, as well as additional inventive features, will be apparent from the description of the invention provided herein.

BRIEF SUMMARY OF THE INVENTION

The invention provides a chemical-mechanical polishing system for polishing a substrate comprising (a) a polishing component selected from the group consisting of a polishing pad, an abrasive, and a combination thereof, (b) a liquid carrier, and (c) a compound selected from the group consisting of (1) a compound of the Formula (I)

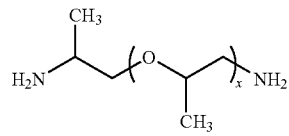

wherein x=2-6, (2) a compound of the Formula (II)

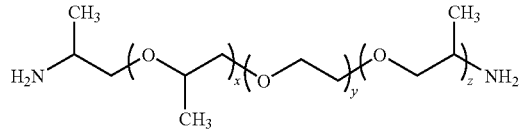

wherein x+z=2-4 and y=1-50, and (3) combinations thereof.

In addition, the invention provides a method of chemically-mechanically polishing a substrate, which method comprises (i) contacting a substrate with a chemical-mechanical polishing system comprising (a) a polishing component selected from the group consisting of a polishing pad, an abrasive, and a combination thereof, (b) a liquid carrier, and (c) a compound selected from the group consisting of a compound of the Formula (I) wherein x=2-6, a compound of the Formula (II) wherein x+z=2-4 and y=1-50, and combinations thereof, (ii) moving the polishing component relative to the substrate, and (iii) abrading at least a portion of the substrate to polish the substrate.

The invention also provides a method of chemically-mechanically polishing a substrate, which method comprises (i) contacting a substrate comprising at least one layer of polysilicon with a chemical-mechanical polishing system comprising (a) a polishing component selected from the group consisting of a polishing pad, an abrasive, and a combination thereof, (b) a liquid carrier, and (c) a compound selected from the group consisting of 4,7,10-trioxatridecane-1,13-diamine, a compound of the Formula (I) wherein x=2-6, a compound of the Formula (II) wherein x+z=2-4 and y=1-50, and combinations thereof, (ii) moving the polishing component relative to the substrate, and (iii) abrading at least a portion of the substrate to polish the substrate.

BRIEF DESCRIPTION OF THE SEVERAL VIEWS OF THE DRAWING(S)

DETAILED DESCRIPTION OF THE INVENTION

Figure 1:
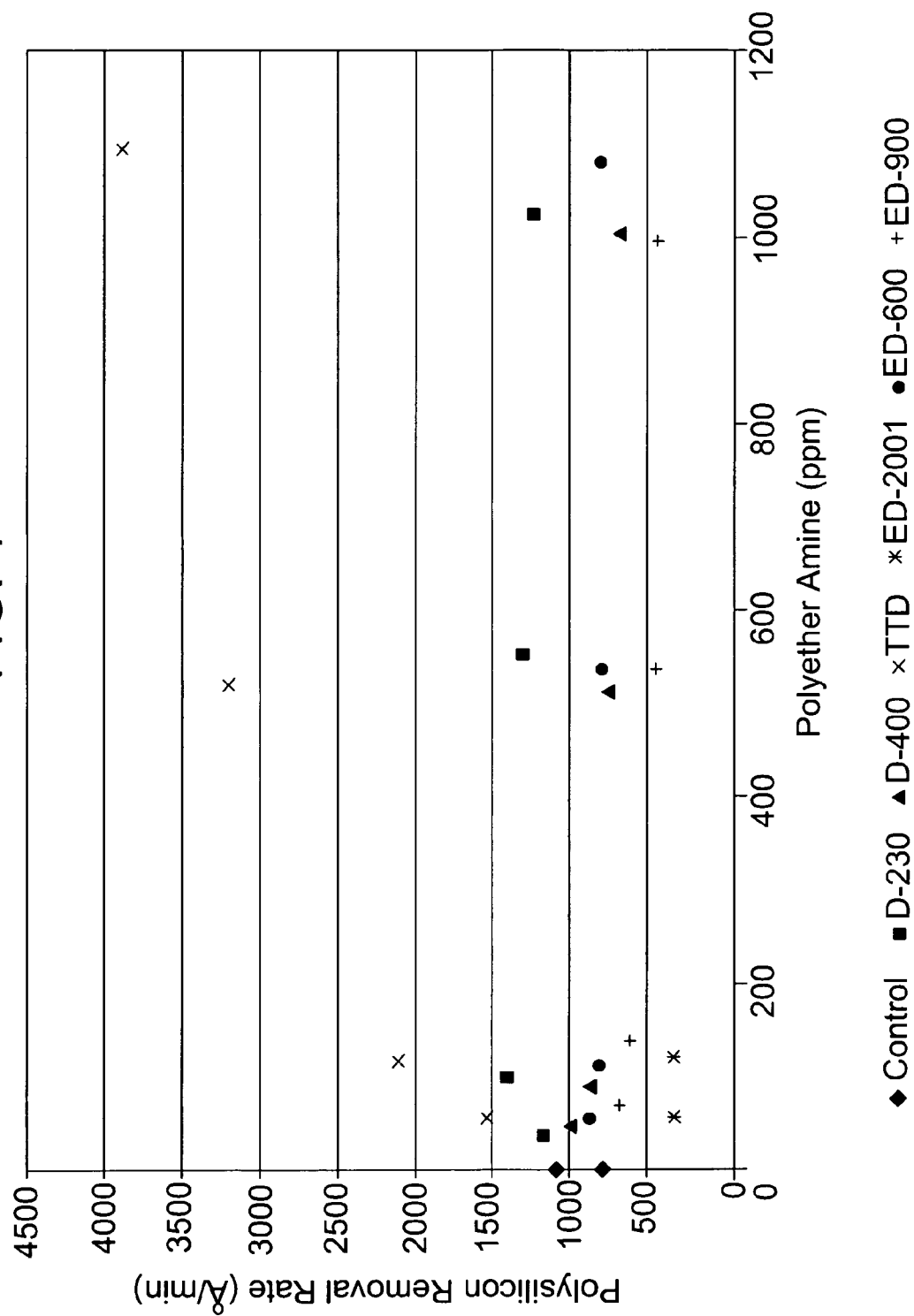
FIG. 1 is a graph of polysilicon removal rate (Å/min) versus polyether amine (ppm) for various compositions containing silica and either 4,7,10-trioxatridecane-1,13-diamine (TTD), a compound of Formula (I) wherein x=2-3 (D-230) or x=5-6 (D-400), or a compound of Formula (II) wherein x+z=3-4 and y=8-9 (ED-600), or x+z=2-3 and y=15-16 (ED-900), or x+z=2-3 and y=40-41 (ED-2001).

The invention provides a chemical-mechanical polishing system for polishing a substrate comprising (a) a polishing component selected from the group consisting of a polishing pad, an abrasive, and a combination thereof, (b) a liquid carrier, and (c) a compound selected from the group consisting of (1) a compound of the Formula (I)

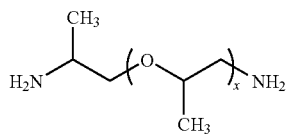

wherein x=2-6, (2) a compound of the Formula (II)

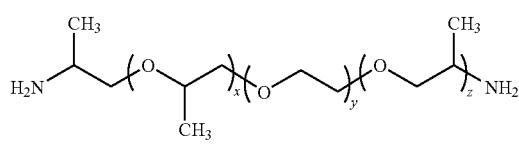

wherein x+z=2-4 and y=1-50, and (3) combinations thereof. The liquid carrier, compound, and any other component dissolved or suspended in the liquid carrier (e.g., an abrasive) constitute the polishing composition. The amounts of components described herein are based on the total weight of the polishing composition unless otherwise specified herein.

It has surprisingly been discovered that the addition of a polyether amine to the polishing composition can be used to increase or adjust the polishing rate of polysilicon while leaving the polishing rate of other layers such as silicon oxide and silicon nitride relatively low. The polyether amine can be any class of amine, such as a monoamine, a diamine, or a triamine. Preferably, the polyether amine is a diamine of Formula (I) wherein x=2-6, Formula (II) wherein x+z=2-4 and y=1-50, or 4,7,10-trioxatridecane-1,13-diamine (TTD). More preferably, the polyether amine is a diamine of Formula (I) wherein x=2-3 (D-230) or x=5-6 (D-400), or a diamine of Formula (II) wherein either (1) x+z=3-4 and y=8-9 (ED-600), (2) x+z=2-3 and y=15-16 (ED-900), or (3) x+z=2-3 and y=40-41 (ED-2001). The polyether amine can have any suitable molecular weight (e.g., about 200 or more, such as about 200 to about 2000). Preferably, the polyether amine is a diamine having a molecular weight of 230, 400, 600, 900, or 2001. Any suitable combination of polyether diamines can be used in the polishing composition. The amount of polyether diamine present in the polishing composition can be adjusted to achieve the desired polysilicon removal rate, while maintaining a low removal rate of silicon oxide and/or silicon nitride. The amount of polyether amine can be, for example, about 5000 ppm or less (e.g., about 4000 ppm or less, about 3000 ppm or less, about 2000 ppm or less, or about 1000 ppm or less) and/or about 10 ppm or more (e.g., about 20 ppm or more, about 50 ppm or more, about 100 ppm or more, or about 200 ppm or more). Preferably, the amount of polyether amine is from about 50 ppm to about 1200 ppm, about 100 ppm to about 1000 ppm, about 200 ppm to about 800 ppm, or about 300 ppm to about 600 ppm.

The polishing composition can further comprise an amine (other than the aforementioned polyether amine), such as a primary amine, a secondary amine, a tertiary amine, an aminoalcohol, a quaternary amine, or combinations thereof. Preferably, the polishing composition comprises tetramethylammonium hydroxide (TMAH) or piperazine. The presence of TMAH in the polishing composition has the ability to increase the rate of removal of polysilicon, as well as suppress the rate of removal of silicon oxide. The amount of amine present in the polishing composition can be adjusted in order to achieve the desired polysilicon removal rate, while maintaining a low removal rate of silicon oxide and/or silicon nitride. The amine can be present, for example, in the polishing composition in an amount of about 5000 ppm or less (e.g., about 4000 ppm or less, about 3000 ppm or less, about 2000 ppm or less, or about 1000 ppm or less) and/or about 10 ppm or more (e.g., about 20 ppm or more, about 50 ppm or more, about 100 ppm or more, or about 200 ppm or more). Preferably, the amine is present in an amount of about 50 ppm to about 1400 ppm, from about 100 ppm to about 1200 ppm, from about 150 ppm to about 1000 ppm, or from about 200 ppm to about 800 ppm.

The substrate to be polished using the method of the invention can be any suitable substrate. Suitable substrates include, but are not limited to, flat panel displays, integrated circuits, memory or rigid disks, metals, interlayer dielectric (ILD) devices, semiconductors, micro-electro-mechanical systems, ferroelectrics, and magnetic heads. Preferably, the substrate comprises silicon, such as polysilicon, epitaxial silicon, doped or undoped silicon metal, monocrystalline silicon, or multicrystalline silicon. More preferably, the substrate comprises doped or undoped polysilicon in combination with silicon oxide and/or silicon nitride. The polysilicon can be any suitable polysilicon, many of which are known in the art. The polysilicon can have any suitable phase, and can be amorphous, crystalline, or a combination thereof. The silicon oxide similarly can be any suitable silicon oxide, many of which are known in the art. Suitable types of silicon oxide include but are not limited to borophosphosilicate glass (BPSG), tetraethyl ortho silicate (TEOS), thermal oxide, undoped silicate glass, and high density plasma (HDP) oxide. In addition, the silicon nitride can be any suitable silicon nitride.

The polishing component can comprise, consist of, or consist essentially of a polishing pad (e.g., polishing surface). The polishing pad can be any suitable polishing pad, many of which are known in the art. Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof.

The polishing pad can comprise fixed abrasive particles on or within the polishing surface of the polishing pad, or the polishing pad can be substantially free of fixed abrasive particles. Fixed abrasive polishing pads include pads having abrasive particles affixed to the polishing surface of the polishing pad by way of an adhesive, binder, ceramer, resin, or the like or abrasives that have been impregnated within a polishing pad so as to form an integral part of the polishing pad, such as, for example, a fibrous batt impregnated with an abrasive-containing polyurethane dispersion. Fixed abrasive pads can eliminate the need for providing an abrasive component in the polishing composition.

The polishing pad can have any suitable configuration. For example, the polishing pad can be circular and, when in use, typically will have a rotational motion about an axis perpendicular to the plane defined by the surface of the pad. The polishing pad can be cylindrical, the surface of which acts as the polishing surface, and, when in use, typically will have a rotational motion about the central axis of the cylinder. The polishing pad can be in the form of an endless belt, which, when in use, typically will have a linear motion with respect to the cutting edge being polished. The polishing pad can have any suitable shape and, when in use, have a reciprocating or orbital motion along a plane or a semicircle. Many other variations will be readily apparent to the skilled artisan.

The polishing component can comprise, consist of, or consist essentially of an abrasive, which can be fixed to the polishing pad as described above or can be suspended in the liquid carrier (e.g., water). The abrasive can be in any suitable form (e.g., abrasive particles). The abrasive typically is in particulate form and is suspended in the liquid carrier (e.g., water). The abrasive can be any suitable abrasive. For example, the abrasive can be natural or synthetic, and can comprise, consist essentially of, or consist of metal oxide, carbide, nitride, carborundum, or the like. The abrasive also can be a polymer particle or a coated particle. The abrasive typically comprises metal oxide particles. Preferably, the abrasive is a metal oxide selected from the group consisting of alumina, ceria, silica, zirconia, co-formed products thereof, and combinations thereof. The abrasive particles typically have an average particle size (e.g., average particle diameter) of about 20 nm to about 500 nm. The particle size of a particle is the diameter of the smallest sphere that encompasses the particle. Preferably, the abrasive particles have an average particle size of about 70 nm to about 300 nm (e.g., about 100 nm to about 200 nm).

Any suitable amount of abrasive can be present in the polishing composition. Typically, about 0.01 wt. % or more (e.g., about 0.05 wt. % or more) abrasive will be present in the polishing composition. More typically, about 0.1 wt. % or more (e.g., about 1 wt. % or more) abrasive will be present in the polishing composition. The amount of abrasive in the polishing composition typically will not exceed about 20 wt. %, more typically will not exceed about 15 wt. % (e.g., will not exceed about 10 wt. %). Preferably, the amount of abrasive in the polishing composition is about 0.1 wt. % to about 15 wt. %, and more preferably about 3 wt. % to about 12 wt. %.

A liquid carrier is used to facilitate the application of the abrasive (when present and suspended in the liquid carrier), polyether amine, and any optional additives to the surface of a suitable substrate to be polished (e.g., planarized). The liquid carrier can be any suitable solvent including lower alcohols (e.g., methanol, ethanol, etc.), ethers (e.g., dioxane, tetrahydrofuran, etc.), water, and mixtures thereof. Preferably, the liquid carrier comprises, consists essentially of, or consists of water, more preferably deionized water.

The polishing composition also may comprise an oxidizing agent, which can be any suitable oxidizing agent for one or more materials of the substrate to be polished with the polishing composition. Preferably, the oxidizing agent is selected from the group consisting of bromates, bromites, chlorates, chlorites, hydrogen peroxide, hypochlorites, iodates, monoperoxy sulfate, monoperoxy sulfite, monoperoxyphosphate, monoperoxyhypophosphate, monoperoxypyrophosphate, organo-halo-oxy compounds, periodates, permanganate, peroxyacetic acid, and mixtures thereof. The oxidizing agent can be present in the polishing composition in any suitable amount. Typically, the polishing composition comprises about 0.01 wt. % or more (e.g., about 0.02 wt. % or more) oxidizing agent. The polishing composition preferably comprises about 20 wt. % or less (e.g., about 15 wt. % or less, or about 10 wt. % or less) oxidizing agent.

The liquid carrier with any components dissolved or suspended therein can have any suitable pH. The actual pH of the polishing composition will depend, in part, on the type of substrate being polished. Typically the polishing composition has a pH of from about 1 to about 13 (e.g., from about 2 to about 12, or from about 3 to about 11). Preferably, the polishing composition has a pH of about 7 or more (e.g., about 8 or more) and/or a pH of about 11 or less (e.g., about 10 or less). The pH can be, for example, from about 8 to about 12 (e.g., from about 9 to about 11).

The pH of the polishing composition can be achieved and/or maintained by any suitable means. More specifically, the polishing composition can further comprise, consist of, or consist essentially of a pH adjustor, a pH buffering agent, or a combination thereof. The pH adjustor can be any suitable pH-adjusting compound. For example, the pH adjustor can be any suitable acid, such as an inorganic or an organic acid, or combination thereof. For example, the acid can be nitric acid. The pH buffering agent can be any suitable buffering agent, for example, phosphates, acetates, borates, sulfonates, carboxylates, ammonium salts, and the like. The polishing composition can comprise, consist of, or consist essentially of any suitable amount of a pH adjustor and/or a pH buffering agent, provided such amount is sufficient to achieve and/or maintain the desired pH of the polishing composition, e.g., within the ranges set forth herein.

The polishing composition optionally comprises a corrosion inhibitor (i.e., a film-forming agent). The corrosion inhibitor can be any suitable corrosion inhibitor. Typically, the corrosion inhibitor is an organic compound containing a heteroatom-containing functional group. For example, the corrosion inhibitor can be a heterocyclic organic compound with at least one 5- or 6-member heterocyclic ring as the active functional group, wherein the heterocyclic ring contains at least one nitrogen atom, for example, an azole compound. Preferably, the corrosion inhibitor contains at least one azole group. More preferably, the corrosion inhibitor is selected from the group consisting of 1,2,3-triazole, 1,2,4-triazole, benzotriazole, benzimidazole, benzothiazole, and mixtures thereof. The amount of corrosion inhibitor used in the polishing composition typically is about 0.0001 wt. % to about 3 wt. % (preferably about 0.001 wt. % to about 2 wt. %) based on the total weight of the polishing composition.

The polishing composition optionally comprises a chelating or complexing agent. The complexing agent is any suitable chemical additive that enhances the removal rate of the substrate layer being removed, or that removes trace metal contaminants in silicon polishing. Suitable chelating or complexing agents can include, for example, carbonyl compounds (e.g., acetylacetonates and the like), simple carboxylates (e.g., acetates, aryl carboxylates, and the like), carboxylates containing one or more hydroxyl groups (e.g., glycolates, lactates, gluconates, gallic acid and salts thereof, and the like), di-, tri-, and poly-carboxylates (e.g., oxalates, oxalic acid, phthalates, citrates, succinates, tartrates, malates, edetates (e.g., dipotassium EDTA), mixtures thereof, and the like), carboxylates containing one or more sulfonic and/or phosphonic groups, and the like. For example, the polishing composition can comprise at least about 0.05 wt. % EDTA (e.g., at least about 0.1 wt. %, at least about 0.5 wt. %, or at least about 1 wt. %), about 5 wt. % or less EDTA (e.g., about 3 wt. % or less or about 2 wt. % or less), or from about 0.05 wt. % to about 5 wt. % EDTA (e.g., from about 0.1 wt. % to about 3 wt. %, from about 0.5 wt. % to about 3 wt. %, or from about 0.5 wt. % to about 2 wt. %). Suitable chelating or complexing agents also can include, for example, di-, tri-, or polyalcohols (e.g., ethylene glycol, pyrocatechol, pyrogallol, tannic acid, and the like), polyphosphonates such as Dequest 2010, Dequest 2060, or Dequest 2000 (available from Solutia Corp.), and amine-containing compounds (e.g., ammonia, amino acids, amino alcohols, di-, tri-, and polyamines, and the like). The choice of chelating or complexing agent will depend on the type of substrate layer being removed.

It will be appreciated that many of the aforementioned compounds can exist in the form of a salt (e.g., a metal salt, an ammonium salt, or the like), an acid, or as a partial salt. For example, citrates include citric acid, as well as mono-, di-, and tri-salts thereof; phthalates include phthalic acid, as well as mono-salts (e.g., potassium hydrogen phthalate) and di-salts thereof, perchlorates include the corresponding acid (i.e., perchloric acid), as well as salts thereof. Furthermore, certain compounds or reagents may perform more than one function. For example, some compounds can function both as a chelating agent and an oxidizing agent (e.g., certain ferric nitrates and the like).

The polishing composition optionally further comprises one or more other additives. Such additives include acrylates comprising one or more acrylic subunits (e.g., vinyl acrylates and styrene acrylates), and polymers, copolymers, and oligomers thereof, and salts thereof.

The polishing composition can comprise a surfactant and/or rheological control agent, including viscosity enhancing agents and coagulants (e.g., polymeric rheological control agents, such as, for example, urethane polymers). Suitable surfactants can include, for example, cationic surfactants, anionic surfactants, nonionic surfactants, amphoteric surfactants, mixtures thereof, and the like. Preferably, the polishing composition comprises a nonionic surfactant. One example of a suitable nonionic surfactant is an ethylenediamine polyoxyethylene surfactant. The amount of surfactant in the polishing composition typically is about 0.0001 wt. % to about 1 wt. % (preferably about 0.001 wt. % to about 0.1 wt. % and more preferably about 0.005 wt. % to about 0.05 wt. %).

The polishing composition can comprise an antifoaming agent. The antifoaming agent can be any suitable anti-foaming agent. Suitable antifoaming agents include, but are not limited to, silicon-based and acetylenic diol-based antifoaming agents. The amount of anti-foaming agent in the polishing composition typically is about 10 ppm to about 140 ppm.

The polishing composition can comprise a biocide. The biocide can be any suitable biocide, for example an isothiazolinone biocide. The amount of biocide in the polishing composition typically is about 1 to about 50 ppm, preferably about 10 to about 20 ppm.

The polishing composition preferably is colloidally stable. The term colloid refers to the suspension of the particles in the liquid carrier. Colloidal stability refers to the maintenance of that suspension through time. A polishing composition is considered colloidally stable if, when the polishing composition is placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the polishing composition ([C] in terms of g/ml) is less than or equal to 0.5 (i.e., $\{[B]-[T]\}/[C] \leq 0.5$). Preferably, the value of $[B]-[T]/[C]$ is less than or equal to 0.3, more preferably is less than or equal to 0.1, even more preferably is less than or equal to 0.05, and most preferably is less than or equal to 0.01.

The polishing composition can be prepared by any suitable technique, many of which are known to those skilled in the art. The polishing composition can be prepared in a batch or continuous process. Generally, the polishing composition can be prepared by combining the components thereof in any order. The term "component" as used herein includes individual ingredients (e.g., oxidizing agent, abrasive, etc.) as well as any combination of ingredients (e.g., water, halogen anion, surfactants, etc.).

The polishing composition can be supplied as a one-package system comprising a polyether amine, a liquid carrier, and optionally an abrasive and/or other additives. Alternatively, some of the components, such as an oxidizing agent, can be supplied in a first container, either in dry form, or as a solution or dispersion in the liquid carrier, and the remaining components, such as the polyether amine, and optionally the abrasive and other additives, can be supplied in a second container or multiple other containers. Other two-container, or three or more container combinations of the components of the polishing composition are within the knowledge of one of ordinary skill in the art.

Solid components, such as an abrasive, can be placed in one or more containers either in dry form or as a solution in the liquid carrier. Moreover, it is suitable for the components in the first, second, or other containers to have different pH values, or alternatively to have substantially similar, or even equal, pH values. The components of the polishing composition can be partially or entirely supplied separately from each other and can be combined, e.g., by the end-user, shortly before use (e.g., 1 week or less prior to use, 1 day or less prior to use, 1 hour or less prior to use, 10 minutes or less prior to use, or 1 minute or less prior to use).

The polishing composition also can be provided as a concentrate which is intended to be diluted with an appropriate amount of liquid carrier prior to use. In such an embodiment, the polishing composition concentrate can comprise a polyether amine, a liquid carrier, and optionally other components in amounts such that, upon dilution of the concentrate with an appropriate amount of liquid carrier, each component will be present in the polishing composition in an amount within the appropriate range recited above for each component. For example, the each component can be present in the concentrate in an amount that is about 2 times (e.g., about 3 times, about 4 times, or about 5 times) greater than the concentration recited above for each component in the polishing composition so that, when the concentrate is diluted with an appropriate volume of liquid carrier (e.g., an equal volume of liquid carrier, 2 equal volumes of liquid carrier, 3 equal volumes of liquid carrier, or 4 equal volumes of liquid carrier, respectively), each component will be present in the polishing composition in an amount within the ranges set forth above for each component. Furthermore, as will be understood by those of ordinary skill in the art, the concentrate can contain an appropriate fraction of the liquid carrier present in the final polishing composition in order to ensure that the polyether amine and other suitable additives, such as an abrasive, are at least partially or fully dissolved or suspended in the concentrate.

In addition, the invention provides a method of chemically-mechanically polishing a substrate, which method comprises (i) contacting a substrate with a chemical-mechanical polishing system as described herein, (ii) moving the polishing component relative to the substrate, and (iii) abrading at least a portion of the substrate to polish the substrate.

The inventive method of polishing a substrate is particularly suited for use in conjunction with a chemical-mechanical polishing (CMP) apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with the polishing pad and the polishing composition of the invention, with the polishing pad moving relative to the substrate, so as to abrade at least a portion of the substrate to polish the substrate.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Desirably, the inspection or monitoring of the progress of the polishing process with respect to a substrate being polished enables the determination of the polishing end-point, i.e., the determination of when to terminate the polishing process with respect to a particular substrate. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643.

Polishing refers to the removal of at least a portion of a surface to polish the surface. Polishing can be performed to provide a surface having reduced surface roughness by removing gouges, crates, pits, and the like, but polishing also can be performed to introduce or restore a surface geometry characterized by an intersection of planar segments.

The method of the invention can be used to polish any suitable substrate, and is especially useful for polishing a substrate comprising at least one layer of polysilicon, silicon oxide, and/or silicon nitride, especially at least one layer of polysilicon and at least one layer of silicon oxide and/or silicon nitride. The polysilicon layer desirably is removed from the substrate at a rate of about 400 Å/min to about 4000 Å/min (e.g., about 500 Å/min to about 3000 Å/min, about 600 Å/min to about 2000 Å/min, or about 700 Å/min to about 1500 Å/min). The silicon oxide layer desirably is removed from the substrate at a rate of about 400 Å/min or less (e.g., about 300 Å/min or less, about 250 Å/min or less, or about 200 Å/min or less). The silicon nitride layer desirably is removed from the substrate at a rate of about 400 Å/min or less (e.g., about 300 Å/min or less, about 250 Å/min or less, or about 200 Å/min or less). As discussed above, these rates can be adjusted by the presence of different amounts of polyether amine and/or an additional amine in the polishing composition.

The following examples further illustrate the invention but, of course, should not be construed as in any way limiting its scope.

EXAMPLE 1

This example demonstrates the ability to adjust the rate of polysilicon removal by using a polishing composition which contains polyether amines.

A polysilicon wafer and a borophosphosilicate glass (BPSG) wafer were polished with six different compositions, each of which contained 12 wt. % fumed silica particles and was adjusted to a pH of 10 with 1320 ppm TMAH. Five of the compositions were further modified by the addition of one of the following: TTD, a compound of Formula (I) wherein x is 2-3 (D-230), a compound of Formula (I) wherein x is 5-6 (D-400), a compound of Formula (II) wherein x+z is 3-4 and y is 8-9 (ED-600), a compound of Formula (II) wherein x+z is 2-3 and y is 15-16 (ED-900), or a compound of Formula (II) wherein x+z is 2-3 and y is 40-41 (ED-2001).

Figure 2:
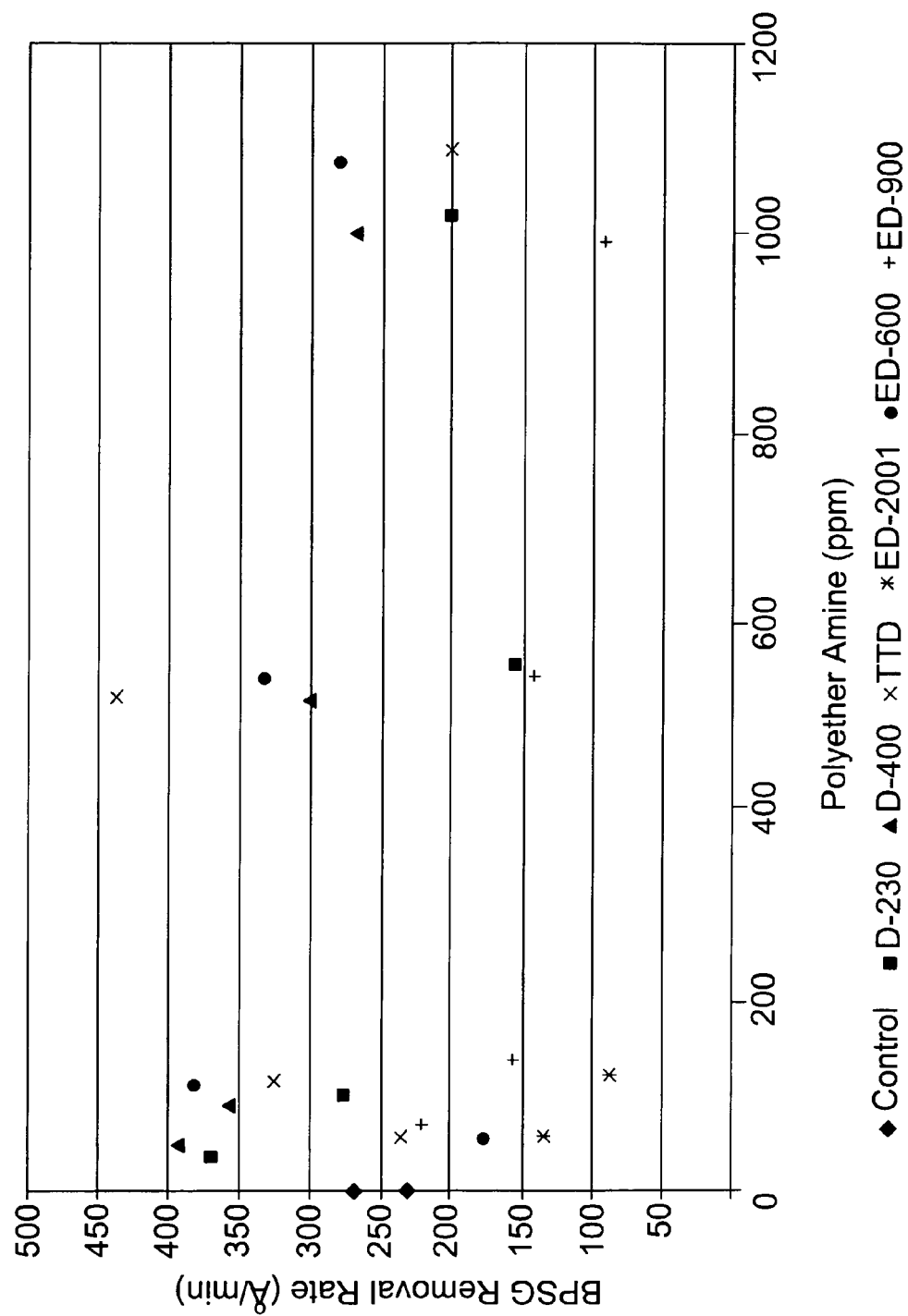
FIG. 2 is a graph of borophosphosilicate glass (BPSG) removal rate (Å/min) versus polyether amine (ppm) for various compositions containing silica and either D-230, D-400, TTD, ED-2001, ED-600, or ED-900.

The polysilicon and BPSB removal rates (Å/min) were determined for each composition, and results are plotted in the graphs of FIG. 1 and FIG. 2.

The data reflected in FIG. 1 and FIG. 2 show the effects of the various compositions (ppm) when used to polish the polysilicon and BPSG wafers (Å/min), respectively. It is apparent from the data presented in both figures that the polysilicon removal rate can be modified from 400 to 4000 Å/min while maintaining low BPSG removal rates by selecting the appropriate polyether amine in the appropriate amount. While not wishing to be bound by any particular theory, it is believed that the molecular weight and hydrophobicity of the polyether amines have a significant impact on the rate of polysilicon removal. Thus, by choosing the correct balance of these two properties, a desired polysilicon removal rate can be achieved.

Figure 3:
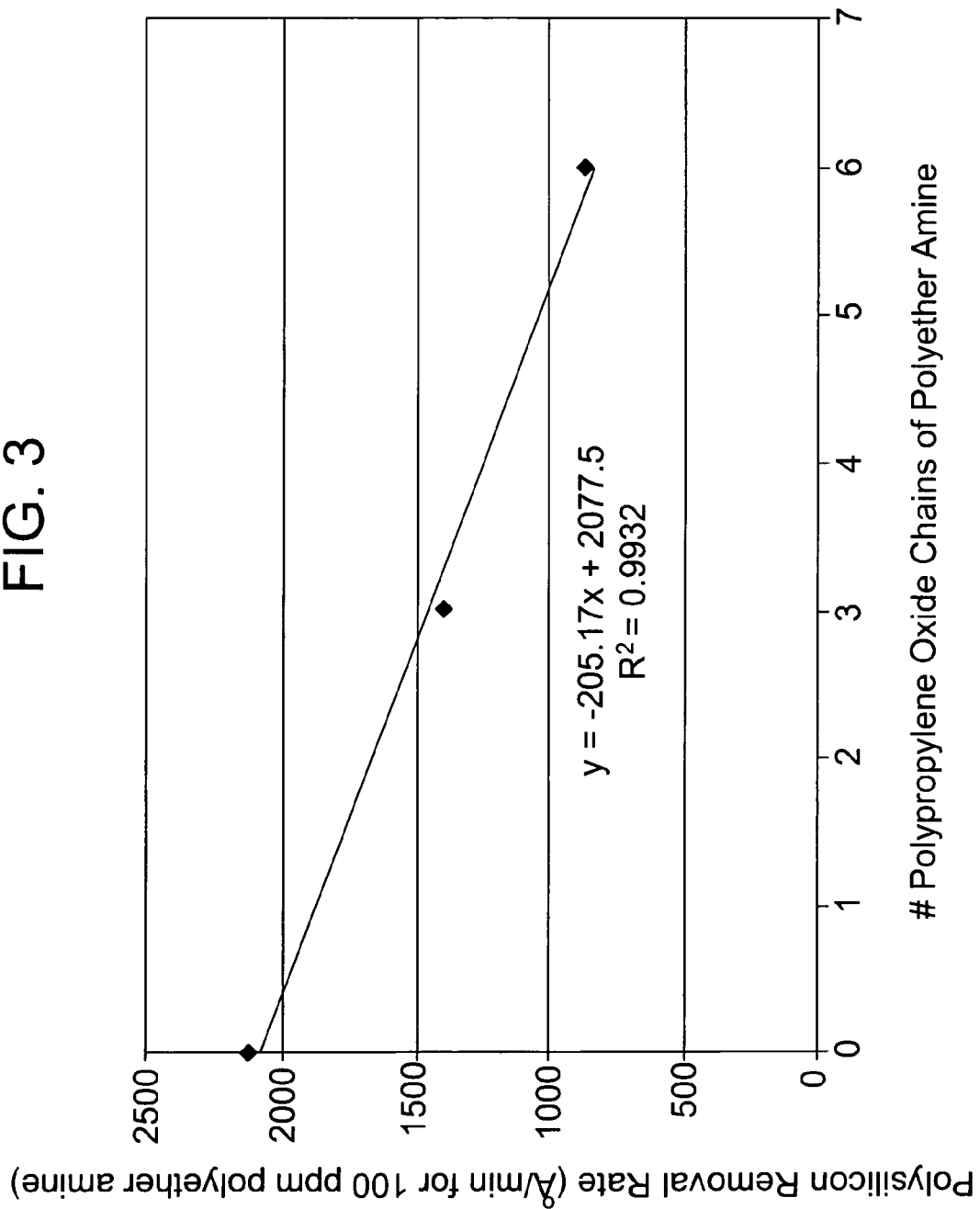
FIG. 3 is a graph of polysilicon removal rate (Å/min with 100 ppm polyether amine) versus the number of polypropylene oxide chains of the polyether amine.
Figure 4:
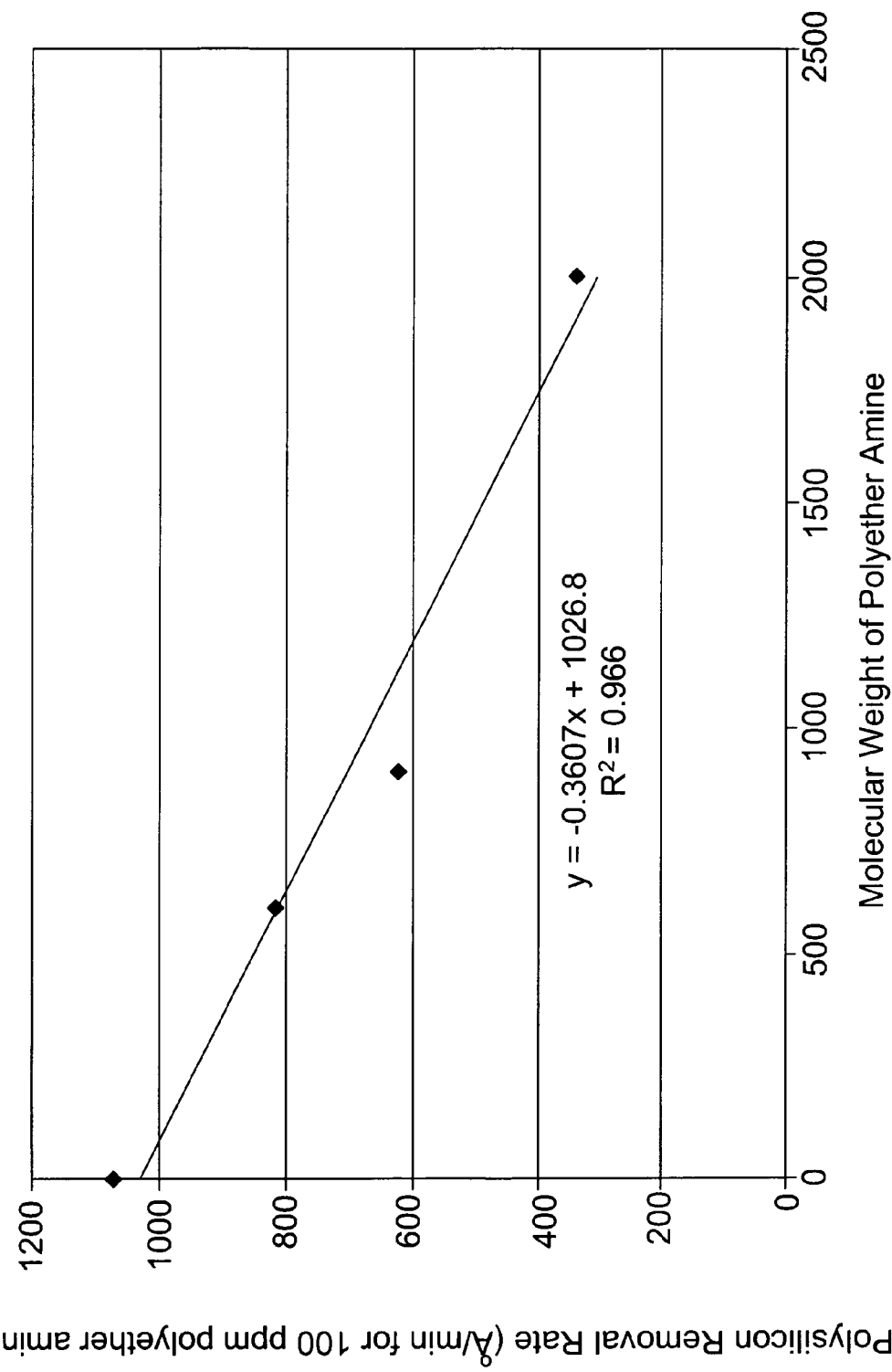
FIG. 4 is a graph of polysilicon removal rate (Å/min with 100 ppm polyether amine) versus the molecular weight of the polyether amine.

FIGS. 3 and 4 illustrate the relationship of hydrophobicity (as reflected by the number of the polypropylene oxide claims) and molecular weight, respectively, of the polyether amine to the rate of polysilicon removal (Å/min). As the number of polypropylene oxide chains or the molecular weight of the amine is increased, the polysilicon removal rate decreases.

EXAMPLE 2

This example further illustrates the effect on the removal rates of polysilicon, silicon oxide, and silicon nitride by the presence of polyether amines in a polishing composition.

A polysilicon wafer, a BPSG wafer, a tetraethyl ortho silicate (TEOS) wafer, and a nitride wafter was polished with three different compositions, each of which contained 12 wt. % fumed silica particles, and was adjusted to a pH of 10 with TMAH and nitric acid. The compositions were further modified by the addition of one of the following: TTD, a compound of Formula (I) wherein x is 2-3 (D-230), or a compound of Formula (II) wherein x+z is 2-3 and y is 15-16 (ED-900).

Figure 5:
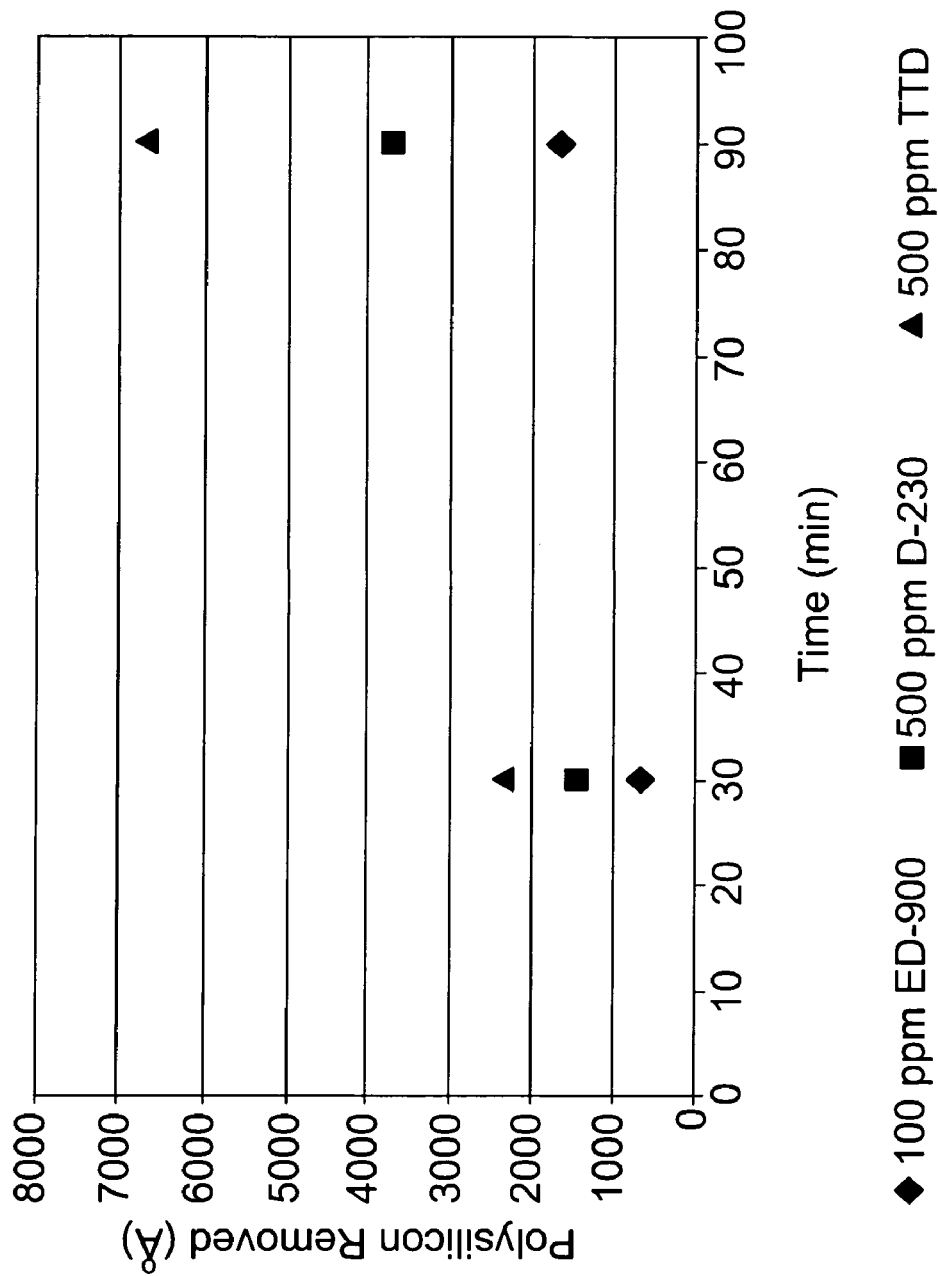
FIG. 5 is a graph of polysilicon removed (Å) versus time (min) for various compositions containing silica and either 100 ppm ED-900, 500 ppm D-230, or 500 ppm TTD.
Figure 6:
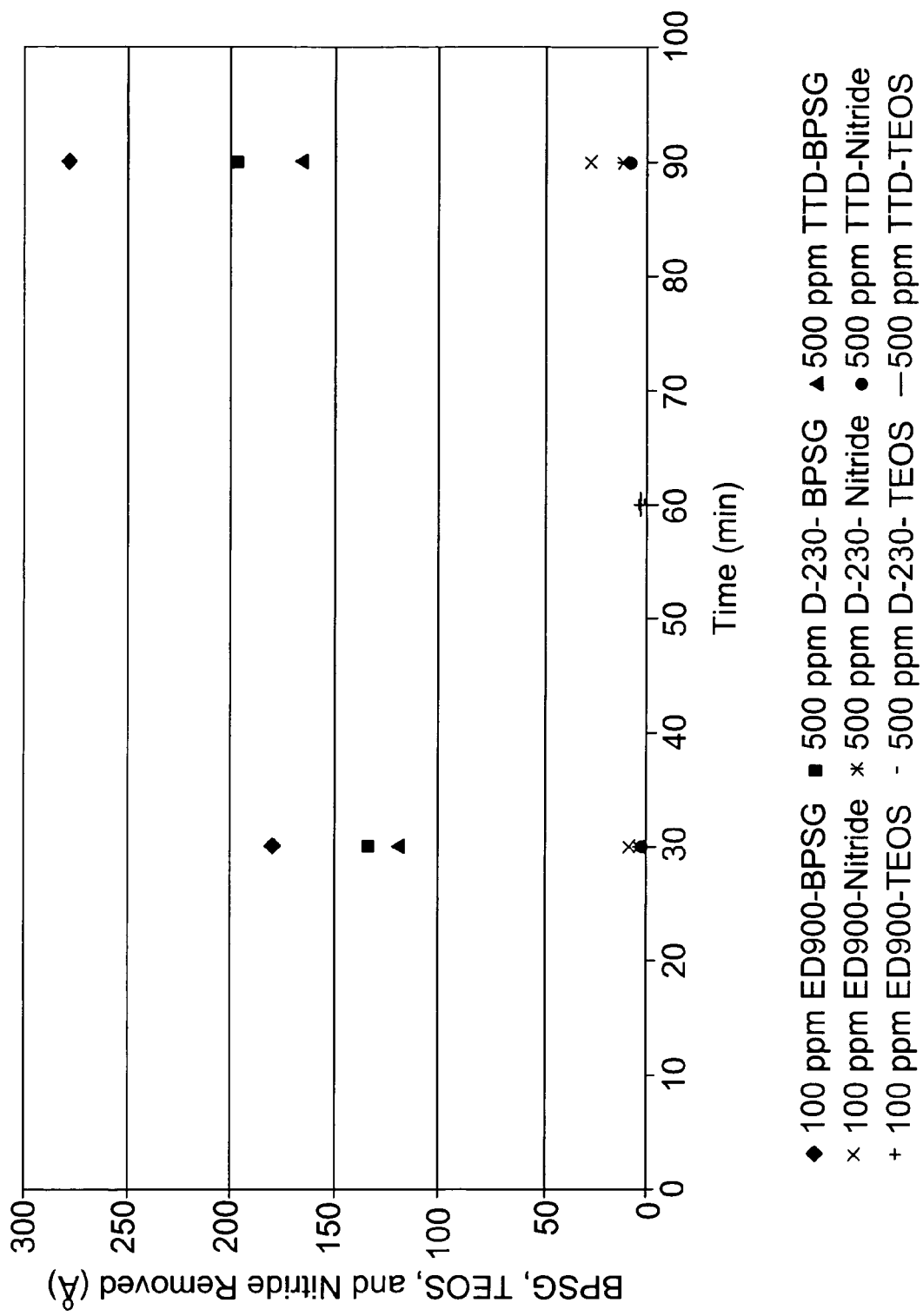
FIG. 6 is a graph of angstroms removed versus time (min) for various compositions containing silica and either ED-900, D-230, or TTD, which were used to polish substrates of BPSG, nitride, and tetraethyl ortho silicate (TEOS).

The polysilicon, BPSG, TEOS and nitride removal rates (Å/min) were determined for each composition and the results are plotted in the graphs of FIG. 5 and FIG. 6.

The data depicted in FIGS. 5 and 6 illustrate the amount of polysilicon removed (Å) and the amounts of silicon oxide and silicon nitride removed (Å) relative to polishing time (min), respectively for each composition. As is apparent from the data presented in the figures, the polysilicon removal rate can be adjusted as desired, while maintaining low rates of removal for both silicon oxide and silicon nitride.

EXAMPLE 3

This example illustrates the effect on the removal rate of silicon nitride and silicon oxide by the presence of polyether amines and/or TMAH in a polishing composition.

A nitride wafter and a TEOS wafer were polished with three different compositions, each of which contained 6 wt. % fumed silica particles, and was adjusted to a pH of 10 with ammonium hydroxide or nitric acid. The compositions were further modified by the addition of TMAH, a compound of Formula (I) wherein x is 2-3 (D-230), or a compound of Formula (I) wherein x is 5-6 (D-400).

Figure 7:
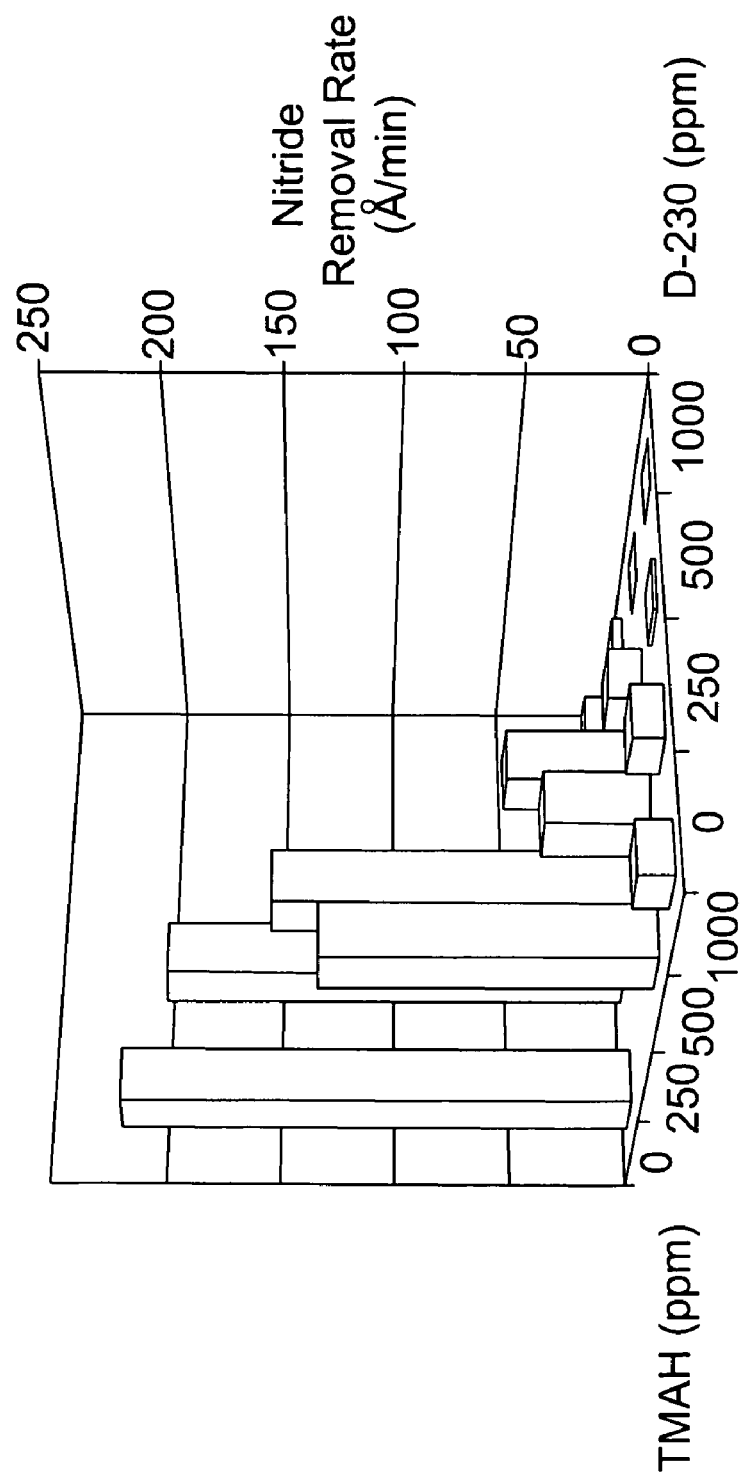
FIG. 7 is a graph of nitride removal rate (Å/min) versus D-230 (ppm) versus tetramethylammonium hydroxide (TMAH) (ppm).
Figure 8:
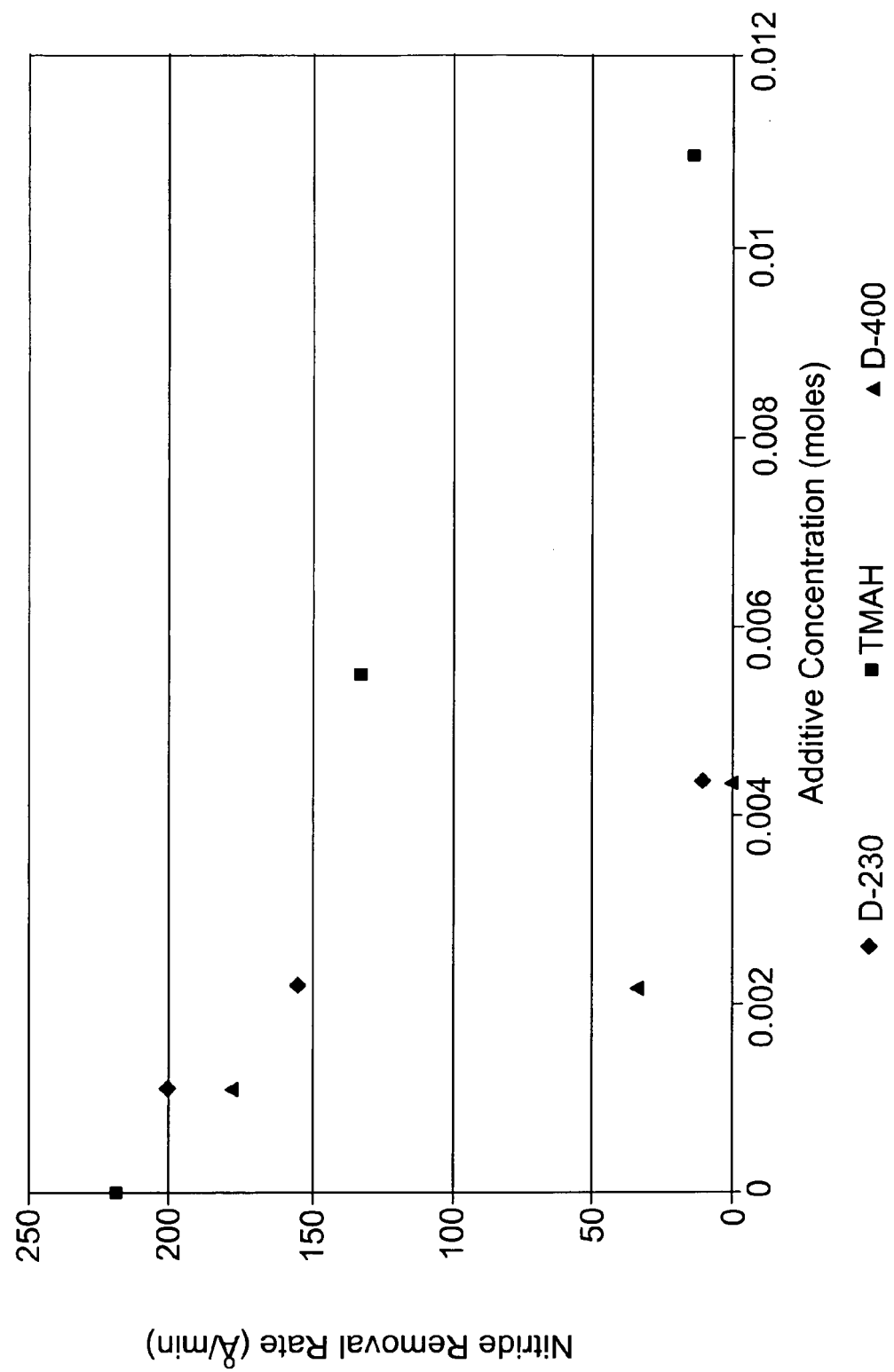
FIG. 8 is a graph of nitride removal rate (Å/min) versus additive concentration (moles) for various compositions containing silica and either D-230, TMAH, or D-400.
Figure 9:
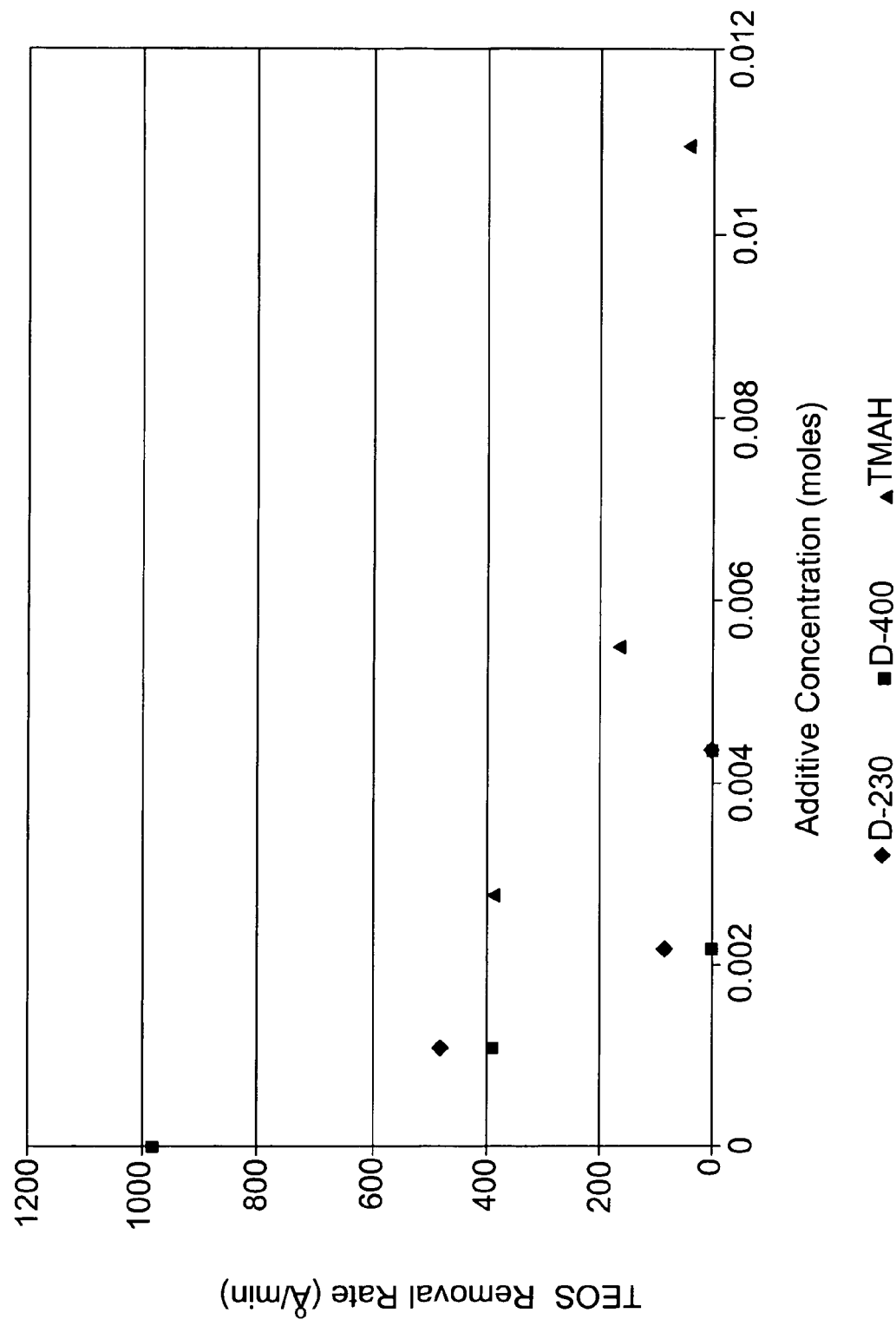
FIG. 9 is a graph of TEOS removal rate (Å/min) versus additive concentration (moles) for various compositions containing silica and either D-230, D-400, or TMAH.

The nitride and TEOS removal rates (Å/min) were determined for each composition, and the results are plotted in the graphs of FIG. 7, FIG. 8, and FIG. 9.

The data reflected in FIG. 7 illustrate the rate of nitride removal (Å/min) relative to the amounts of D-230 (ppm) and TMAH (ppm) added to the polishing composition. The data reflected in FIGS. 8 and 9 show the rate of nitride or TEOS removal (Å/min), respectively, relative to the amount of D-230, TMAH, or D-400 added to the polishing composition (moles). As is apparent from the data presented in the figures, the presence of polyether amines in the polishing composition, either alone or in combination with a quaternary amine such as TMAH, can maintain low rates of silicon nitride and silicon oxide removal.

EXAMPLE 4

This example illustrates the effect on the removal rates of polysilicon, silicon oxide, and silicon nitride by the presence of polyether amines and/or TMAH in a polishing composition, and by the pH of the composition itself.

A polysilicon wafer, a nitride wafter, a BPSG wafer, and a TEOS wafer were polished with compositions containing 300 ppm of a compound of Formula (I) wherein x is 2-3 (D-230), varying amounts of fumed silica particles, and varying amounts of TMAH, at different pH's.

Figure 10:
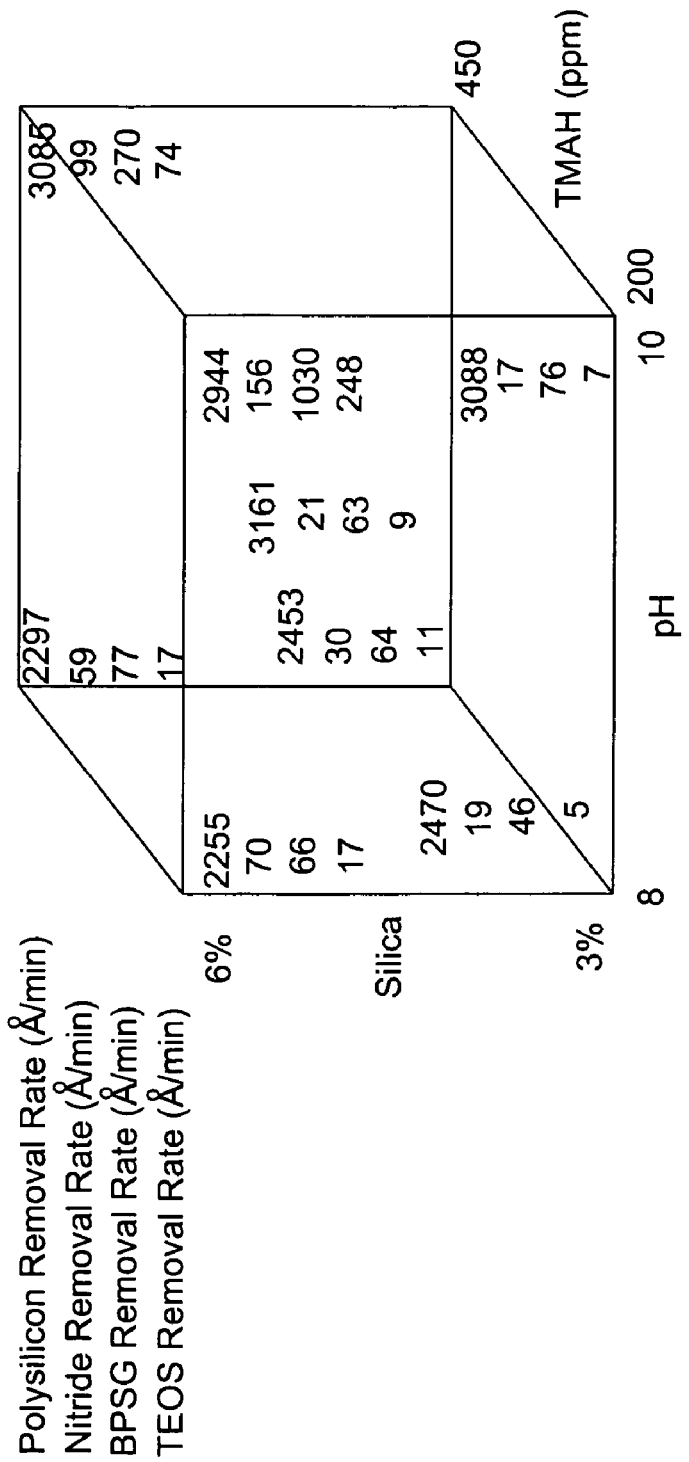
FIG. 10 is a graph of silica (%) versus pH versus TMAH (ppm) for the removal rates (Å/min) of polysilicon, nitride, BPSG, and TEOS substrates when polished with a composition containing 300 ppm D-230.

FIG. 10 shows the effect of the pH, the amount of TMAH (ppm), and the amount of abrasive (wt. %) in the polishing composition on the removal rates of polysilicon, BPSG, TEOS, and silicon nitride (Å/min). As is apparent from the data reflected in FIG. 10, the polysilicon removal rate was affected primarily by the pH and the presence of D-230, whereas the silicon oxide removal rate, and to some extent, the silicon nitride removal rate, were affected by the amount of TMAH present in the polishing composition.

EXAMPLE 5

This example demonstrates the effect on the removal rate of silicon by the presence of TTD in a polishing composition.

A 200 mm P− bare silicon wafer was polished with two different compositions, each containing 30 wt. % condensation-polymerized silica. One of the two compositions was further modified by the addition of 1 wt. % TTD and 1 wt. % piperazine (the inventive composition). The control composition had a pH of 9.1-9.5, while the inventive composition has a pH of 10.8.

Figure 11:
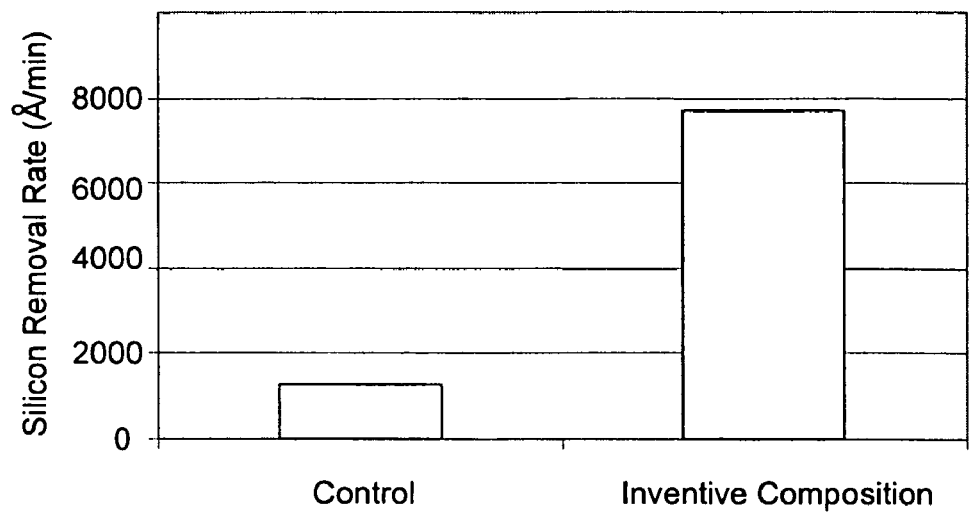
FIG. 11 is a bar graph of the silicon removal rate (Å/min) exhibited by two different compositions, one of which contains TTD and piperazine.

The silicon removal rate (Å/min) was determined for each composition, and the results are plotted in the graph of FIG. 11.

The data depicted in FIG. 11 illustrates the amount of silicon removed (Å/min) by each composition. As is apparent from the data presented in FIG. 11, the silicon removal rate was increased by the addition of TTD and piperazine to the polishing composition.

EXAMPLE 6

This example demonstrates the effect on the amount of copper that diffuses into the surface of a silicon substrate by the presence of metal chelators in a polishing composition.

A 300 mm P+ epitaxial wafer was polished with two different compositions, each containing 30 wt. % condensation-polymerized silica and 1 wt. % TTD. One of the two compositions also contained 0.1 wt. % Dequest 2060 and 0.75 wt. % NH$_4$OH and had a pH of 11. The other composition was further modified by the addition of 1 wt. % EDTA, 1 wt. % piperazine, and 0.52 wt. % KOH, and had a pH of 10.8.

Following polishing and cleaning, the wafers were subjected to out-diffusion in a furnace. During this process, any diffused copper present on the surface of the wafer was collected by vapor phase decomposition and analyzed using an atomic absorption spectrometer.

Figure 12:
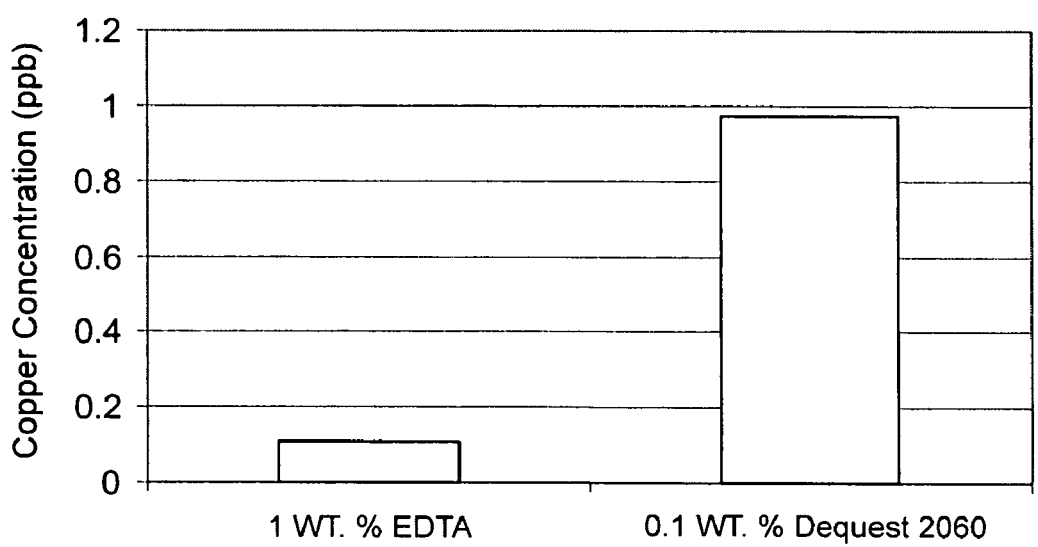
FIG. 12 is a bar graph of the concentration of copper (ppb) diffused from a substrate polished with two different compositions, one of which contains EDTA.

The copper concentration (ppb) in the wafer was determined for each composition, and the results are plotted in the graph of FIG. 12.

The data depicted in FIG. 12 illustrates that the addition of 1 wt. % EDTA to the polishing composition greatly reduced the diffusion of copper, from the slurry into the wafer, when compared with the polishing composition containing 0.1 wt. % Dequest 2060. The control experiment of polishing a similar wafer with a similar composition, but containing no metal chelator, was not evaluated in this particular experiment.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
    (a) an abrasive,
    (b) a liquid carrier, and
    (c) a compound selected from the group consisting of
        (1) a compound of the Formula (I)

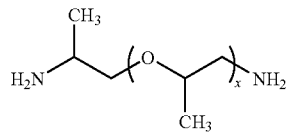

wherein x=2-6,
    (2) a compound of the Formula (II)

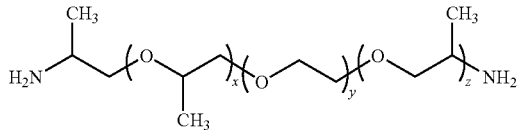

wherein x+z=2-4 and y=1-50, and
    (3) combinations thereof, wherein the concentration of the compound is about 50 ppm to about 1200 ppm.

2. The polishing composition of claim 1, wherein the polishing composition further comprises a compound selected from the group 4,7,10-trioxatridecane-1,13-diamine, piperazine, and combinations thereof.

3. The polishing composition of claim 1, wherein the polishing composition comprises a compound of the Formula (I) wherein x is 2-3 or x=5-6.

4. The polishing composition of claim 1, wherein the polishing composition comprises a compound of Formula (II) wherein either (1) x+z=3-4 and y=8-9, (2) x+z=2-3 and y=15-16, or (3) x+z=2-3 and y=40-41.

5. The polishing composition of claim 1, wherein the polishing composition further comprises a component different from the compound and selected from the group consisting of primary amines, secondary amines, tertiary amines, aminoalcohols, quaternary amines, and combinations thereof.

6. The polishing composition of claim 5, wherein the component is tetramethylammonium hydroxide.

7. The polishing composition of claim 1, wherein the polishing composition further comprises a compound selected from the group consisting of EDTA, oxalic acid, polyphosphonates, and combinations thereof.

* * * * *